US006502662B1

(12) United States Patent
Nakamura et al.

(10) Patent No.: US 6,502,662 B1
(45) Date of Patent: Jan. 7, 2003

(54) SPEAKER HAVING A HEMISPHERICAL VIBRATOR

(75) Inventors: Takeshi Nakamura, Uji (JP); Takayuki Kaneko, Kyoto (JP); Yutaka Murai, Nagaokakyo (JP); Takao Mouri, Osaka-fu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/593,377

(22) Filed: Jun. 15, 2000

(30) Foreign Application Priority Data

Jun. 16, 1999 (JP) .......................................... 11-169177

(51) Int. Cl.$^{7}$ ................................................. H05K 5/00

(52) U.S. Cl. ....................... 181/152; 181/155; 181/159; 381/340; 381/190; 381/191; 381/396

(58) Field of Search ................................ 181/152, 153, 181/155, 159, 179, 195, 167, 168; 381/338, 340, 160, 190, 191, 396, 430, 409

(56) References Cited

U.S. PATENT DOCUMENTS 4,152,552 A * 5/1979 Meyer ................. 179/115.5 H
4,440,983 A * 4/1984 Facoetti et al. .......... 179/110 A
4,845,776 A * 7/1989 Bittencourt ................. 381/190
5,778,084 A * 7/1998 Kling et al. ................ 381/156
5,802,196 A * 9/1998 Nakamura .................. 381/202
6,141,429 A * 10/2000 Heinouchi .................. 381/398

FOREIGN PATENT DOCUMENTS

JP 55104200 A * 8/1980 ........... H04R/17/00
JP 09168194 A * 6/1997 ........... H04R/01/34
JP 09322283 A * 12/1997 ........... H04R/01/30
JP 11239396 A * 8/1999 ........... H04R/01/34
JP 2000333295 A * 11/2000 ........... H04R/17/00
JP 2001008290 A * 1/2001 ........... H04R/17/00
JP 2001016689 A * 1/2001 ........... H04R/17/00

* cited by examiner

*Primary Examiner*—Robert E. Nappi
*Assistant Examiner*—Edgardo San Martin
(74) *Attorney, Agent, or Firm*—Keating & Bennett, LLP

(57) ABSTRACT

A speaker includes a disk-shaped base. A substantially hemispherical surface vibrator is fitted into a substantially circular groove provided in the base and bonded therein. Terminals are attached to electrodes provided on both surfaces of the vibrator. The terminals, passing through the terminal grooves provided in the base, are led out in a direction that is substantially perpendicular to the plane of the base. Further, a horn as a separate member may be attached to the outer surface side of the vibrator.

14 Claims, 9 Drawing Sheets

22

SPEAKER HAVING A HEMISPHERICAL VIBRATOR

BACKGROUND OF THE INVENTION

1. Field of the Invention

The present invention relates to a speaker, and more specifically, the present invention relates to a speaker including a substantially hemispherical surface vibrator.

2. Description of the Related Art

A speaker including a hemispherical surface vibrator has been disclosed in Japanese Patent Application No. 7-347884 (Japanese Unexamined Patent Publication No, 9-168194. In this speaker 1, as shown in FIG. 9, electrodes 3*a* and 3*b* are provided on both surfaces of a hemispherical surface vibrating body 2 made of a piezoelectric material. By inputting a signal between these electrodes 3*a* and 3*b,* the vibrating body 2 vibrates so that an acoustic wave is produced. The edge portion of the vibrating body 2 is attached to a base 4.

In the base 4, a horn portion 5 is provided which has a hole (sound path) that gradually increases in size from the inner surface side of the vibrating body 2 toward the outside. With the horn portion 5, an acoustic wave radiating from the inner surface side of the vibrating body 2, caused by the vibration of the vibrator 2, passes through the horn portion 5 and is directed to the outside. An acoustic wave radiating from the outer surface side of the vibrating body 2 and an acoustic wave radiating from the inner surface side have a phase difference of 180°. However, the sound waves are manipulated by the horn portion 5 such that the sound waves are in substantially the same phase in a direction parallel to the installation plane of the speaker 1.

As described above, in this speaker 1, since the vibrating body 2 has a hemispherical surface shape, an acoustic wave is radiated omnidirectionally from the curved outer surface side of the vibrating body 2. Further, an acoustic wave radiated from the inner surface side of the vibrating body 2, passing through the sound path of the horn portion 5, is radiated omnidirectionally in the direction parallel to the installation plane of the speaker 1. Accordingly, this speaker 1 can be used as a non-directional speaker. Further, a speaker that converts electric signals to acoustic signals very efficiently is produced, due to the utilization of an acoustic wave radiated from the outer surface side of the vibrating body 2 and also an acoustic wave radiated from the inner surface side thereof.

However, since such a speaker utilizes an acoustic wave radiated from the inner surface side of the vibrating body, the speaker must include an integrally formed base and horn portion. Regarding the shape of the hole provided in the horn portion, the hole is shaped such that it gradually increases in size from the inner surface side of the vibrating body to the outside. This shape is difficult to manufacture, and thus the base and the horn portion are difficult to produce. To effectively utilize a sound wave radiated from the inner surface side of the vibrating body, a gap between the base and the vibrating body-must be accurately maintained. Thus, the production of such a speaker requires close tolerances which increases the cost and difficulty of manufacturing.

SUMMARY OF THE INVENTION

Accordingly, preferred embodiments of the present invention provide a speaker including a substantially hemispherical surface vibrating body that is economically manufactured.

According to a preferred embodiment of the present invention, a speaker includes a substantially hemispherical surface vibrator, a driving mechanism arranged to vibrate the vibrator, and a flat base plate to fix the edge portion of the vibrator.

In such a speaker, the vibrating body is made of a piezoelectric material, and the driving mechanism includes electrodes provided on the inner surface and the outer surface of the vibrator.

Further, the speaker includes a horn disposed on the outer surface side of the vibrator and having a hole that gradually increases in diameter as the distance from the vibrator increases.

Moreover, the horn reflects an acoustic wave produced by vibration of the vibrator, and further vibrates with the vibration of the vibrator.

In a preferred embodiment of the present invention, the horn is fixed to a flat base plate.

In the speaker according to another preferred embodiment of the present invention, only an acoustic wave radiated from the outer surface side of the hemispherical surface vibrating body is utilized. Thus, it is unnecessary to provide a horn portion that is integral with a base because the speaker does not utilize an acoustic wave radiated from the inner surface side. Therefore, the base arranged to fix the edge portion of the hemispherical surface vibrating body is configured to have a flat plate shape, and the speaker is therefore economically produced.

The substantially hemispherical surface vibrating body is made of a piezoelectric material, or other suitable material. To drive the vibrating body, electrodes are provided on the both surfaces of the vibrating body.

Further, by attaching a horn having a gradually increasing diameter toward the outside to the outer surface side of the vibrating body, an acoustic wave that is radiated from the outer surface side of the vibrating body and reaches the inner surface of the horn is reflected. Thus, the directions of sound waves to be radiated from the speaker are accurately set, and the sound pressure level in the radiation direction is greatly improved.

By configuring the speaker so that the horn is vibrated with the vibration of the vibrating body, the sound pressure level in the bass is greatly improved.

Other features, elements, characteristics and advantages of the present invention will become apparent from the detailed description of preferred embodiments thereof with reference to the drawings attached hereto.

DETAILED DESCRIPTION OF PREFERRED EMBODIMENTS

Figure 1:
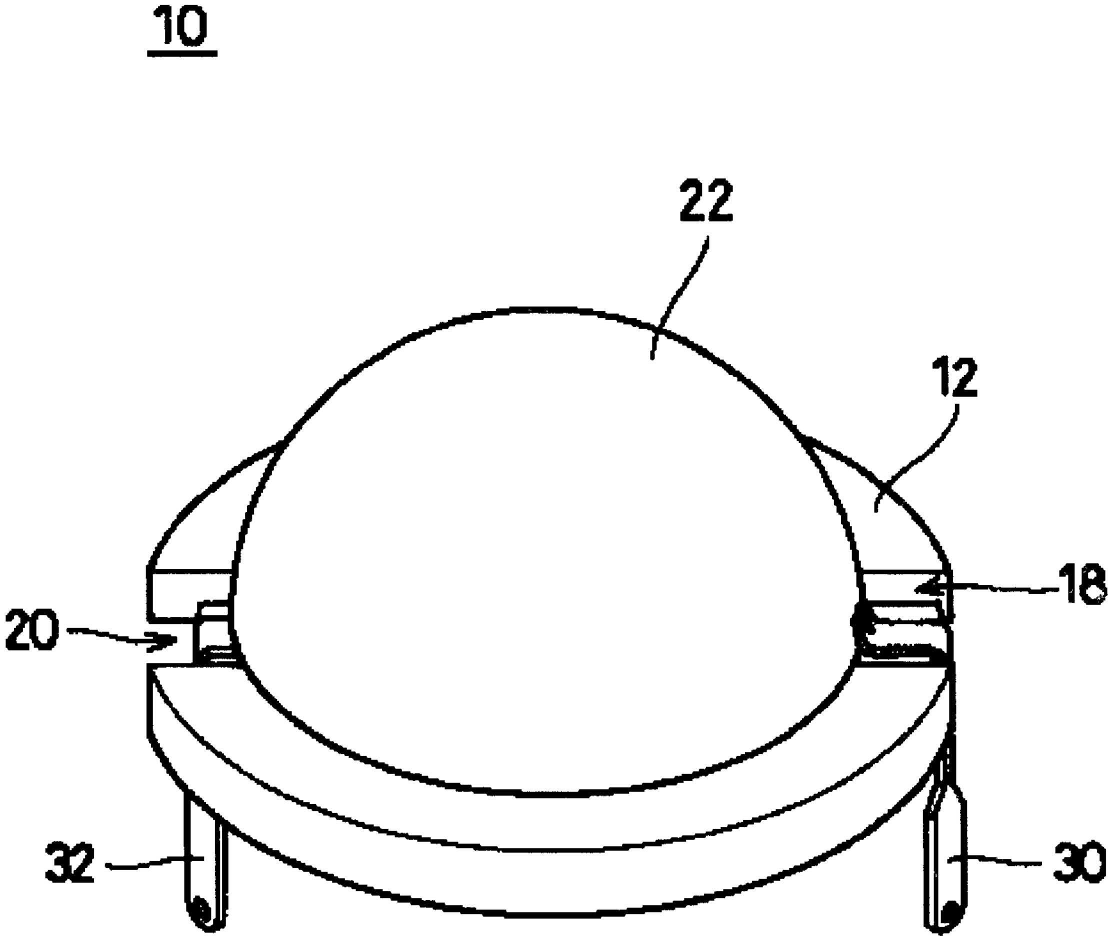
FIG. 1 is a perspective view showing an example of the speaker of the present invention.
Figure 2:
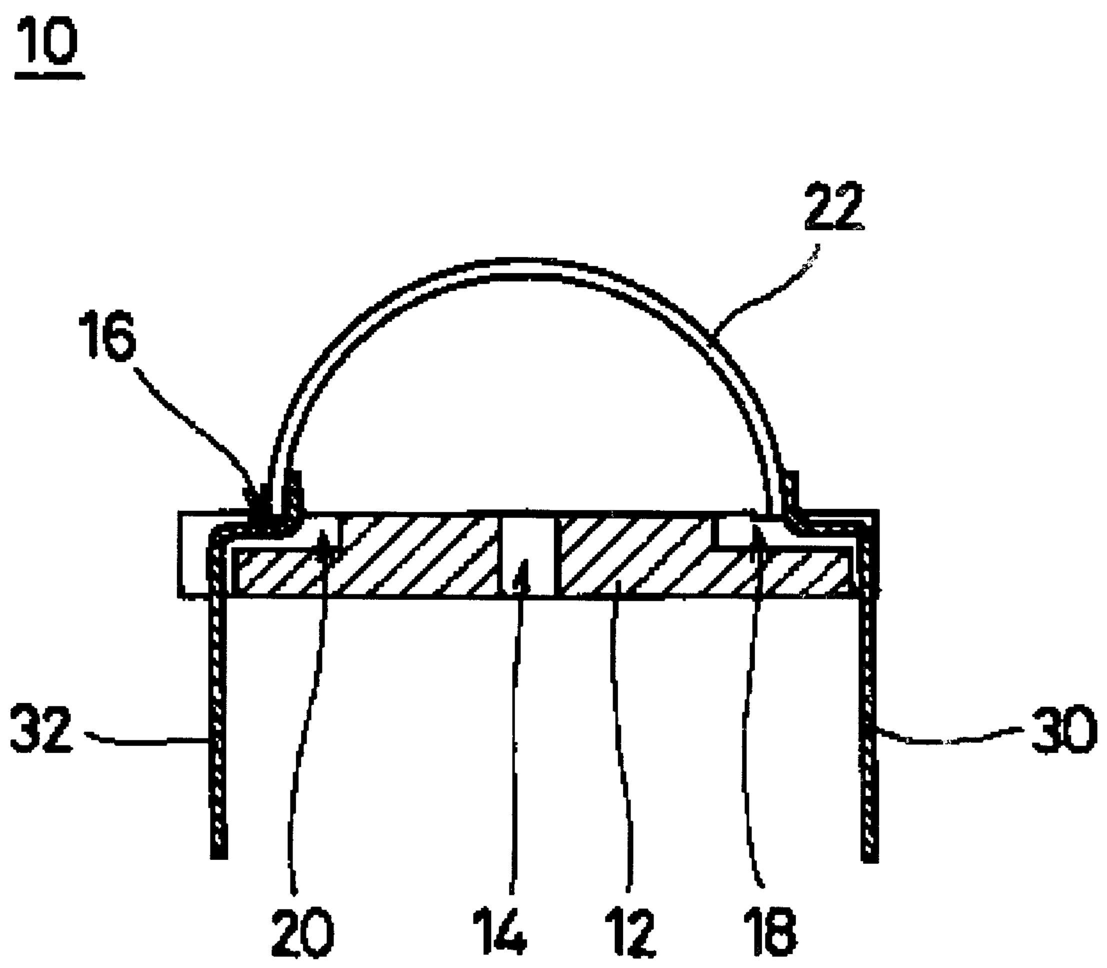
FIG. 2 is an illustrative cross-section of the speaker shown in FIG. 1.

FIG. 1 is a perspective view showing a speaker according to a preferred embodiment of to the present invention. FIG. 2 is a cross-sectional view of the speaker shown in FIG. 1.

A speaker 10 includes a flat-plate base 12. The base 12 all preferably has a disk-shape and is preferably made of aluminum, or other suitable material. A small hole 14 is provided in the center of the base 12. Further, a substantially circular groove 16 is provided along the outer circumference of the base 12 on one surface of the base 12. Terminal grooves 18 and 20 are provided in opposite end portions of the base 12, respectively. Each of the terminal grooves 18 and 20 recessed from the one surface of the base 12 toward the edge portion thereof. The terminal grooves 18 and 20 are arranged such that terminals described later are led out toward the other surface side of the base 12.

Figure 3:
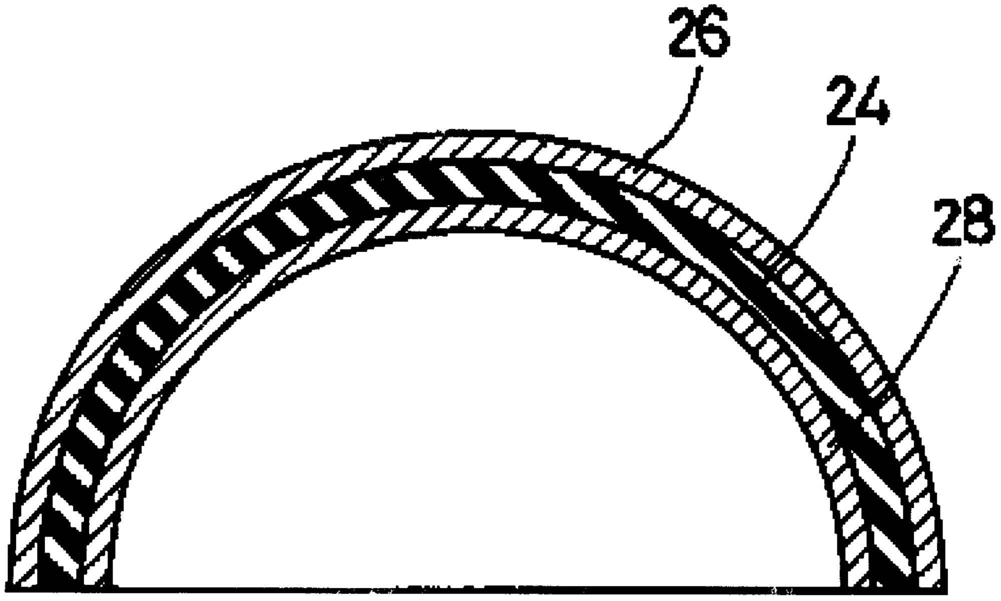
FIG. 3 is a cross-section of the vibrator used in the speaker shown in FIG. 1.

A substantially hemispherical surface vibrator 22 is provided on and fixed to the one surface of the base 12. The vibrator 22, as shown in FIG. 3, includes a substantially hemispherical surface vibrating body 24 made of a piezoelectric ceramic or other suitable material. The vibrating body 24 is polarized in the thickness direction. As a driving mechanism for vibrating the vibrating body 24, electrodes 26 and 28 are provided on both surfaces of the vibrating body 24. The electrodes 26 and 28 are provided by plating, vapor-depositing, sputtering, or other suitable methods, a conductive material such as gold, silver, nickel, or-other suitable material on the vibrating body 24.

Figure 4:
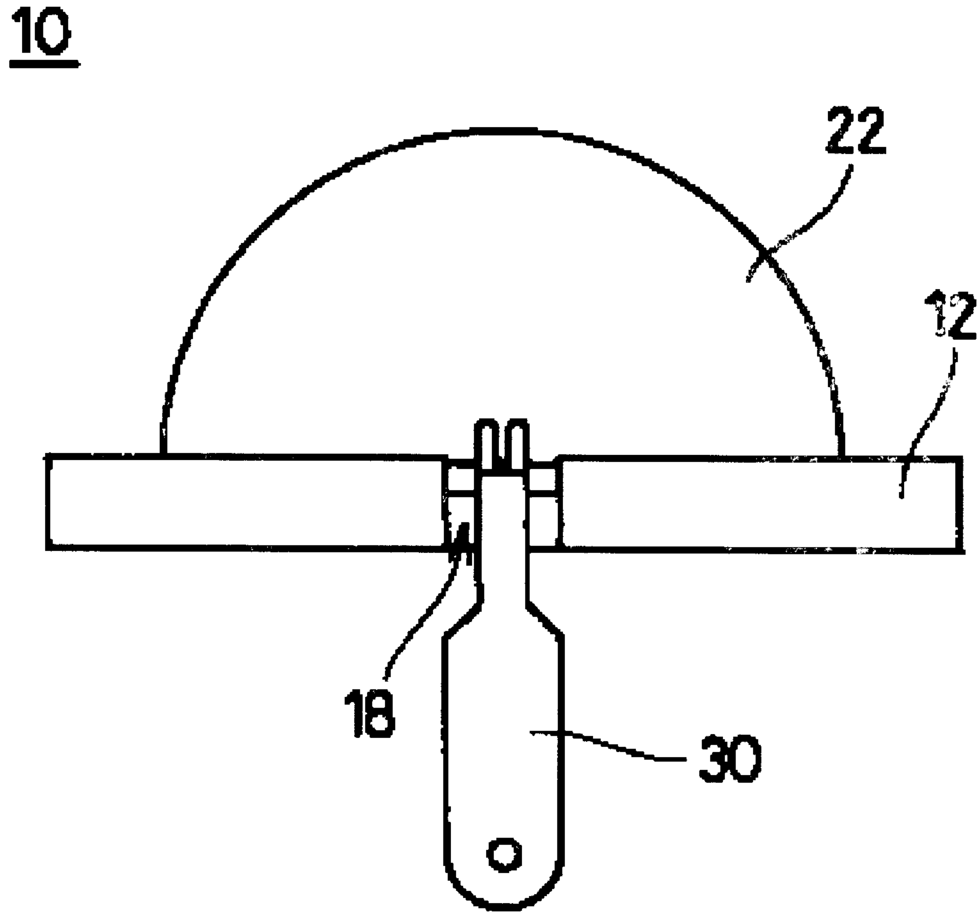
FIG. 4 is an illustration showing the vibrator and a terminal being connected to each other in the speaker shown in FIG. 1.
Figure 5:
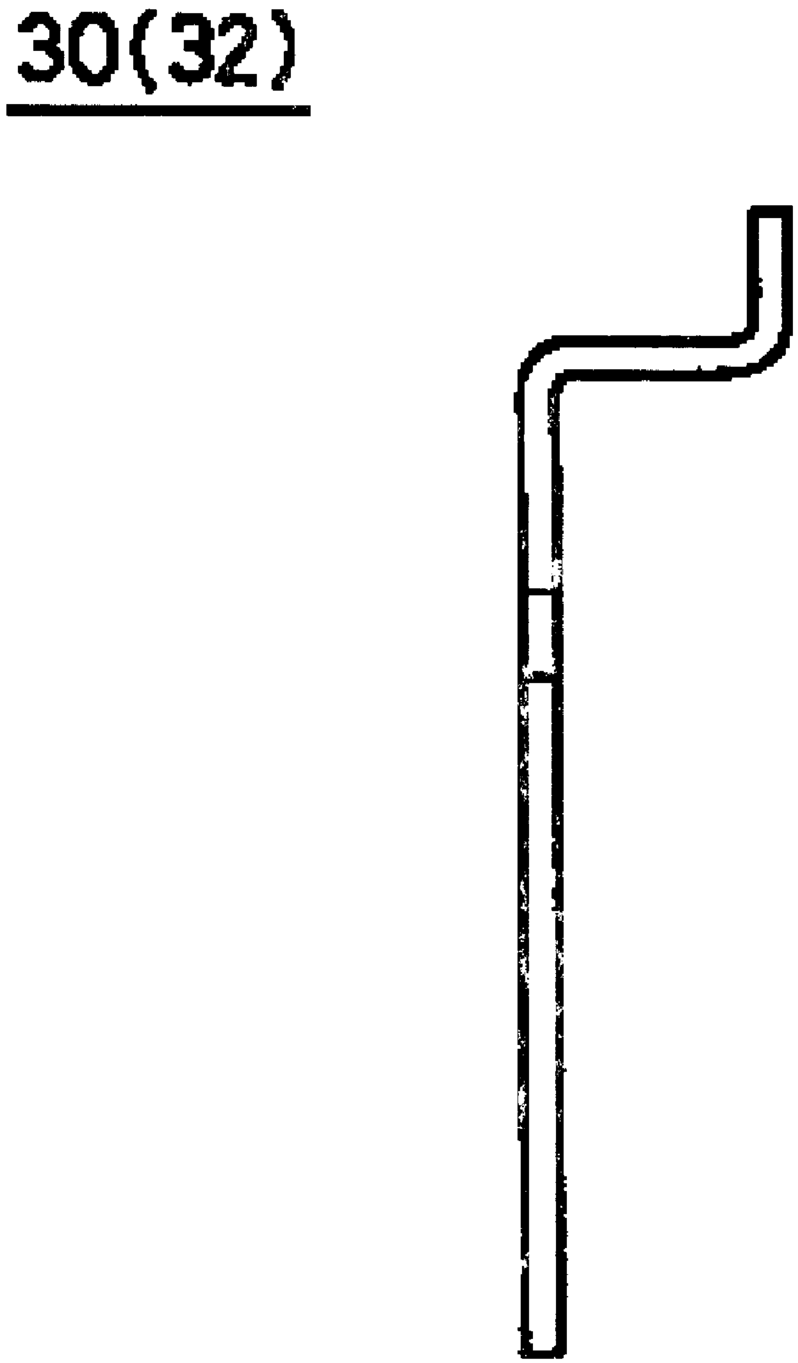
FIG. 5 is a side view of the terminal shown in FIG. 4.

The vibrator 22 is fitted into the substantially circular groove 16 provided on the base 12. The edge portion of the vibrator 22 is bonded in the groove 16 of the base 12 with an adhesive having insulation properties. Then, the small hole 14 provided in the base 12 functions as a degassing hole so that heat generated in the bonding process does not cause the air inside to expand and form a gap between the vibrator 22 and the base 12, which causes the bonding to be unstable. Moreover, terminals 30 and 32 are fixed to the electrodes 26 and 28 provided on both surfaces of the vibrating body 24. The terminals-30 and 32 are configured in a crank-shape as shown in FIGS. 4 and 5. The tip portion of each terminal is divided into two portions because, when the tip portion of each terminal is not divided, a large gap develops between the periphery of the terminal and the periphery of the electrode of the vibrator, thus, making it difficult to solder the terminal. This occurs because the terminal is soldered to the spherical surface of the vibrator 22. Moreover, with terminals that are not divided, the solder tends to adhere to a bent portion of the terminal, so that the solder, which does not contribute to the connection between the electrode and the terminal, remains on the terminal.

With the tips of the terminals 30 and 32 divided into two portions, contact between the tips of the terminals 30 and 32 and the sphere is greatly improved. In addition, the solder flows between the divided tips of each terminal 30 and 32, thus improving the connection between the electrodes 26, 28 and the terminals 30, 32.

The terminal 30 is connected to the electrode 26 provided on the outer surface of the vibrating body 24, and the terminal 32 is connected to the electrode 28 provided on the inner surface of the vibrating body 24. The terminals 30 and 32, passing the terminal grooves 18 and 20 provided in the base 12, are led out perpendicularly to the surface of the base 12, respectively.

To avoid short-circuiting between the terminals 30, 32 and the base 12, gaps are provided between the insides of the terminal grooves 18, 20 and the terminals 30, 32. If the base 12 is made of aluminum, the base and the terminals 30 and 32 may contact each other if an insulation film is provided by alumite-treating the surface of the aluminum, or a resin film with insulation properties is provided thereon. When the base 12 is made of an insulation material, such as a resin with insulation properties or other suitable insulation material, a gap is not required between the terminals 30, 32 and the base 12.

The vibrating body 24 of speaker 10 is vibrated by inputting a signal to the terminals 30 and 32, so that an acoustic wave is radiated from the curved outer surface of the vibrator 22. However, the acoustic wave radiated from the inner surface of the vibrator 22 is not radiated outside because the base 12 is provided. It should be noted that the small hole 14 in the approximate center of the base 12 is provided to allow air present inside to escape, and does not allow radiation of the acoustic wave from the inside to the outside.

In this speaker 10 which utilizes no acoustic wave radiated from the inner surface of the vibrator 22, it is not necessary to provide a horn portion on the base 12. The production of the speaker 10 is much more efficient and economical because a horn portion having a complicated shape on the base 12 is not required. Therefore, production costs of the speaker 10 are greatly reduced.

Figure 6:
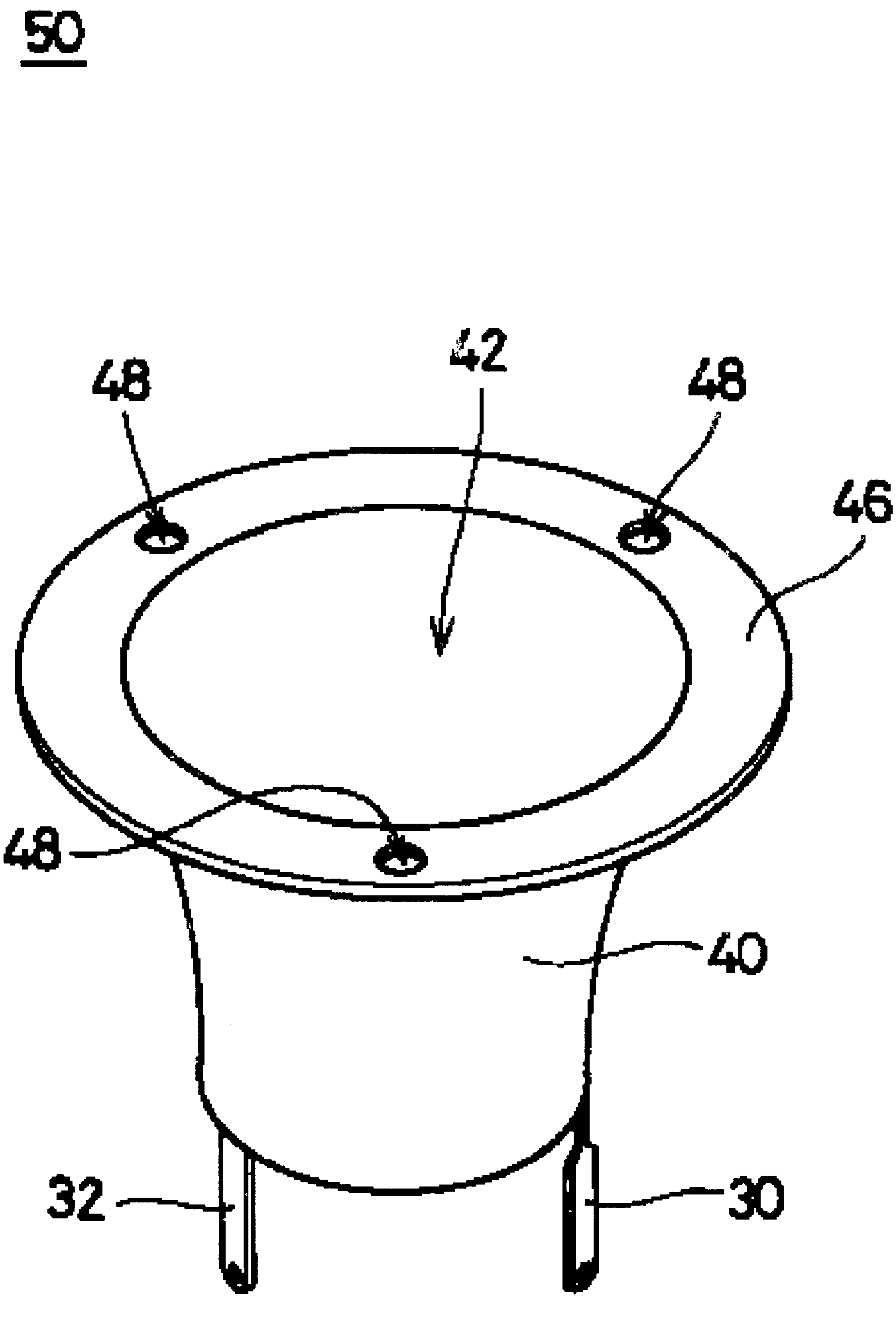
FIG. 6 is a perspective view showing a horn attached to the speaker shown in FIG. 1.
Figure 7:
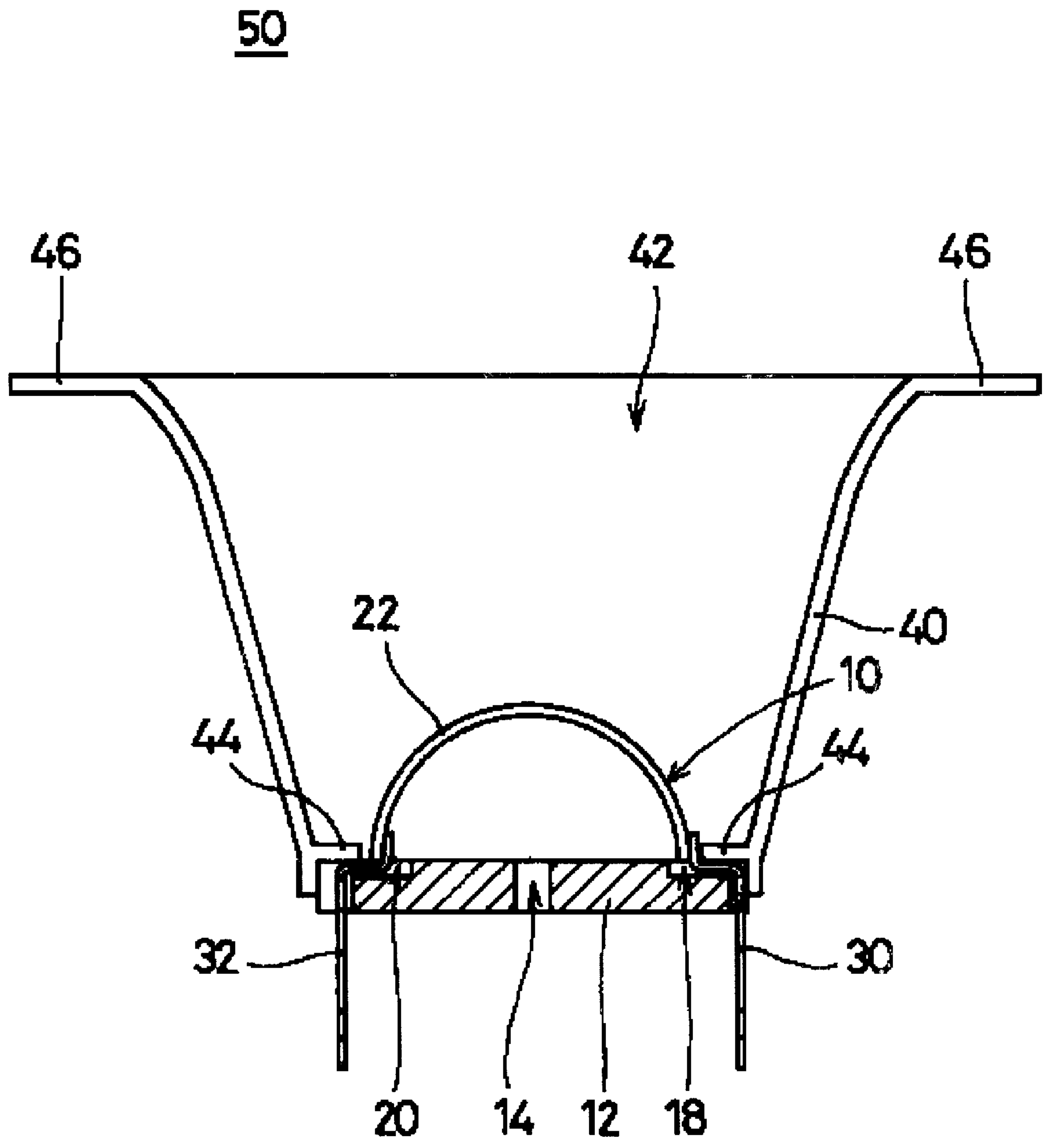
FIG. 7 is an illustrative cross-section of the speaker shown in FIG. 7.

Speaker 10 can be used as a tweeter by configuring the vibrator 22 to have a diameter of about 20 mm. In this case, the speaker 10, in combination with speakers for midrange and bass, constitute a speaker system. With a speaker system having the speaker 10 incorporated therein, it is difficult to acquire a sound pressure level of about 90 dB which is required over the whole range of the treble. To acquire the necessary sound level, as shown in FIGS. 6 and 7, a speaker 50 including a speaker 10 combined with a horn 40 is provided. In the horn 40 of the speaker 50, as the acoustic wave moves away from the vibrator 22 through the sound path, the diameter of a hole in the horn gradually increases. A flange 44 is arranged to extend toward the inside of the horn 40 on the narrow hole side of the sound path 42. The end portion of the one surface of the base 12 is bonded to the flange 44. The vibrator 22 is disposed on the sound path 42 side of the horn 40.

Moreover, in the end portions on the wide hole side of the sound path 42, a flange 46 is provided which extends toward the outside of the horn 40. In the flange 46, three attachment holes 48 are disposed. These attachment holes 48 are used to attach the speaker 50 to a baffle plate, or other suitable structure, in a speaker system in which the speaker 50 is combined with speakers for the other acoustic ranges. The horn 40 is preferably made of a material such as an ABS resin, or other suitable material, so as to be thin.

In the speaker 50 having this horn 40 attached thereto, an acoustic wave, radiated from the outer surface of the vibrator 22, is reflected from the inner wall of the horn 40 such that the acoustic wave is transmitted in a single direction. Therefore, a high sound pressure level is achieved. In addition, by making the horn 40 of a light-weight material such as an ABS resin, or other suitable material, so as to be thin, the horn 40 can vibrate with the vibration of the vibrator 22. By vibrating the horn 40, the sound pressure level on the bass side is greatly improved.

Figure 8:
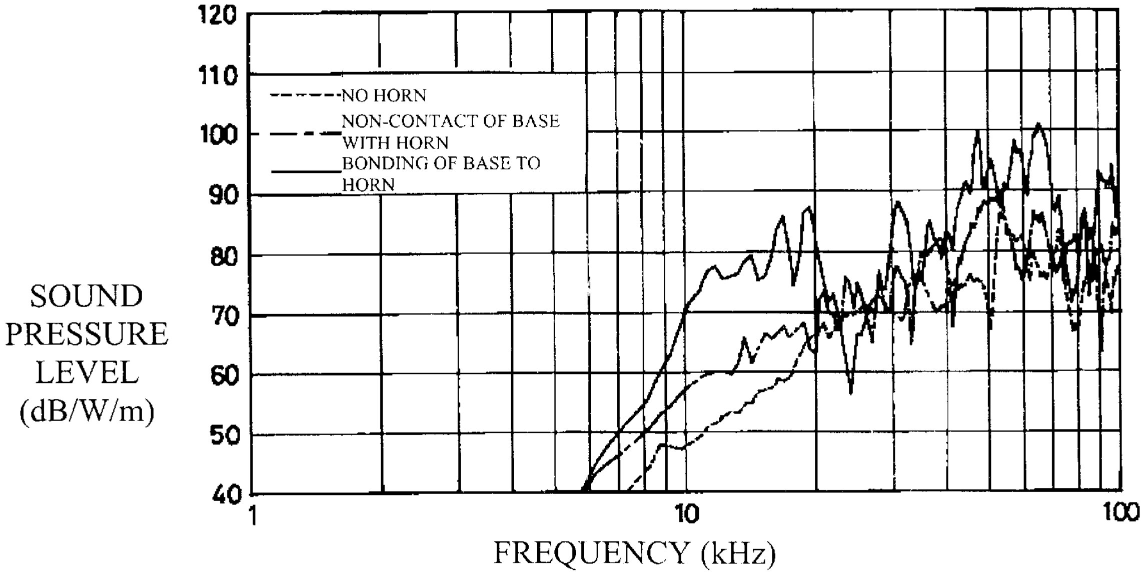
FIG. 8 is a graph showing the characteristics of the sound pressure levels of the speaker not using the horn, the speaker in which the base and the horn is not in contact with each other, and the speaker in which the base and the horn are bonded to each other.
Figure 9:
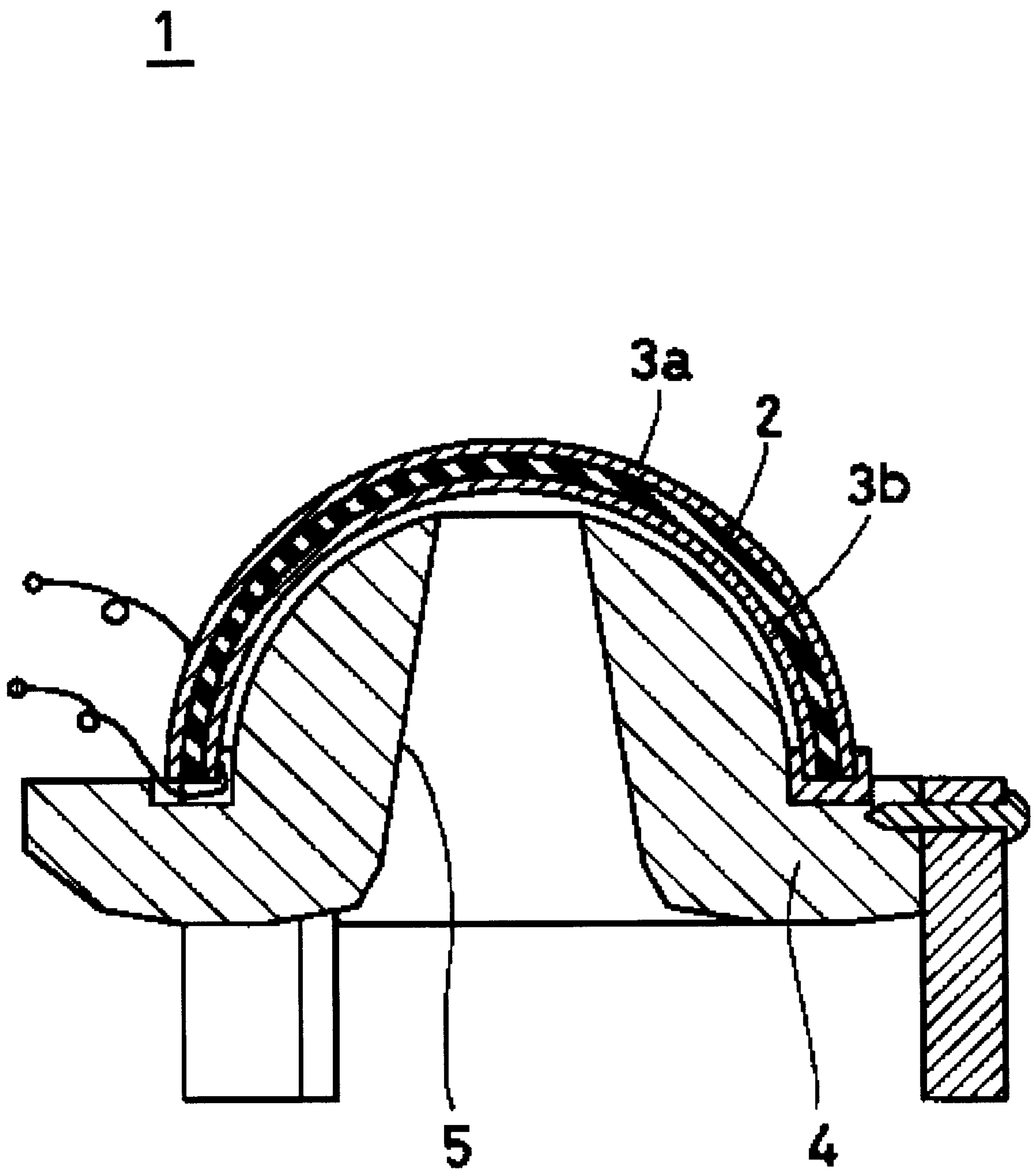
Fig. 9 PRIOR ART
FIG. 9 is a cross-section showing an example of a conventional speaker.

FIG. 8 illustrates the sound levels produced by the speaker 10 not having the horn 40 attached thereto, a speaker (not illustrated) using the horn that is not in contact with the base, and the speaker 50 in which the base 12 is bonded to horn 40. Regarding the speaker (not illustrated) in which the base and the horn were not in contact with each other, the horn was used only for reflection. Further, for the speaker 50 in which the base 12 and the horn 40 were bonded to each other was used for both reflection and vibration.

As seen in FIG. 8, regarding the speaker (not illustrated) using the horn only for reflection, a higher sound pressure level as a whole was obtained as compared with the speaker 10 not using the horn. Further, regarding the speaker 50 using the horn 40 for both of reflection and vibration, a higher sound pressure level is obtained as compared with the speaker (not illustrated) using the horn only for reflection. In addition, it is understood that the sound pressure level is greatly improved especially on the bass side by using the horn 40 for vibration.

By using the horn 40, a higher sound pressure level is achieved. The speaker 50 is suitable for use in combination with other speakers to define a speaker system. Since the horn 40 is made as a separate member, the horn 40 is manufactured in a more economical manner, as compared with a conventional member in which base and horn portions are integrated with each other. The speaker 10 can be manufactured easily and at a lower cost, even when it includes the horn 40.

When the horn 40 is preferably made of a material with a high mass, the horn 40 reflects the acoustic wave but does not act as a vibration plate. Therefore, a thin metal or other suitably low mass material is preferably used to make the horn 40.

According to preferred embodiments of the present invention, the structures of the base and the horn are simplified, thus enabling economical production of a speaker. A required sound pressure level is attained by reflecting an acoustic wave radiated from the vibrator with the horn, and further, by vibrating the horn itself with the vibration of the vibrator.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A speaker comprising:

a substantially hemispherical surface vibrator having an outer surface and an inner surface;

a driving mechanism arranged to vibrate the vibrator; and a flat-plate base arranged to fix an edge portion of the vibrator, and to completely block-acoustic waves generated by the inner surface of said vibrator.

2. A speaker according to claim 1, wherein the vibrator includes a piezoelectric material, and the driving mechanism includes electrodes provided on an inner surface and an outer surface of said vibrator.

3. A speaker according to claim 1, wherein said speaker includes a horn disposed on the outer surface side of the vibrator and having a hole with a diameter that gradually increases as the distance from the vibrator increases.

4. A speaker according to claim 3, wherein the horn is arranged to reflect an acoustic wave produced by vibration of the vibrator, and is arranged to vibrate with the vibration of the vibrator.

5. A speaker according to claim 3, wherein the horn is fixed to the flat-plate base.

6. A speaker according to claim 1, wherein said flat-plate base includes a substantially circular groove on one surface thereof, said substantially hemispherical surface vibrator being fixed to said flat-plate base in said substantially circular groove.

7. A speaker according to claim 1, wherein said flat-plate base includes a plurality of terminal grooves provided therein.

8. A speaker according to claim 7, wherein said driving mechanism includes electrodes provided on an inner surface and an outer surface of said vibrator, and a plurality of terminals, one of said plurality of terminals being connected to said electrode on the inner surface of said vibrator, another one of said plurality of terminals being connected to said electrode on the outer surface of said vibrator, and said plurality of terminals extending through said plurality of terminal grooves.

9. A speaker according to claim 1, wherein said flat-plate base includes a small hole in an approximately central portion thereof.

10. A speaker according to claim 3, wherein said horn includes a first flange at a first end portion thereof, said horn is connected to said flat-plate base via said first flange portion.

11. A speaker according to claim 3, wherein said horn includes a second flange at a second end portion thereof, and having a plurality of attachment holes therein to attach the speaker to a baffle plate of a speaker system.

12. A speaker according to.. claim 4, wherein said horn is composed of a light-weight thin metal to enable the horn to vibrate with the vibration of the vibrator.

13. A speaker according to claim 1, wherein said flat-plate base is disk-shaped to completely block the acoustic wave generated by the inner surface of said vibrator.

14. A speaker according to claim 1, wherein said driving mechanism includes a plurality of terminals, each of said plurality of terminals having a divided tip portion.

* * * * *